US010638621B1

(12) United States Patent
Alexander

(10) Patent No.: US 10,638,621 B1
(45) Date of Patent: Apr. 28, 2020

(54) TERMINAL HOUSING WITH CONDUCTIVE CLIP

(71) Applicant: Sumitomo Wiring Systems, Ltd., Yokkaichi (JP)

(72) Inventor: Christopher Alexander, Farmington, MI (US)

(73) Assignee: Sumitomo Wiring Systems, Ltd., Yokkaichi-Mie (JP)

( * ) Notice: Subject to any disclaimer, the term of this patent is extended or adjusted under 35 U.S.C. 154(b) by 0 days.

(21) Appl. No.: 16/427,850

(22) Filed: May 31, 2019

(51) Int. Cl.
*H01R 12/55* (2011.01)
*H05K 5/00* (2006.01)

(52) U.S. Cl.
CPC ........... *H05K 5/0069* (2013.01); *H01R 12/55* (2013.01); *H05K 5/0047* (2013.01)

(58) Field of Classification Search
CPC ..... H05K 5/0069; H05K 5/0047; H01R 12/55
USPC ........................................................ 174/549
See application file for complete search history.

(56) References Cited

U.S. PATENT DOCUMENTS

| 5,715,135 | A | * | 2/1998 | Brussalis | ............ | B60R 16/0238 |
| | | | | | | 361/622 |
| 5,954,466 | A | * | 9/1999 | Coffey | .................... | B25B 27/16 |
| | | | | | | 411/119 |
| 6,077,102 | A | * | 6/2000 | Borzi | ................... | H01R 9/2458 |
| | | | | | | 439/364 |
| 6,570,088 | B1 | * | 5/2003 | Depp | .................. | B60R 16/0238 |
| | | | | | | 174/50 |
| 6,679,708 | B1 | * | 1/2004 | Depp | ................... | H01R 9/2466 |
| | | | | | | 361/752 |
| 8,961,198 | B2 | * | 2/2015 | Ferran Palau | ........... | H01R 4/58 |
| | | | | | | 439/76.2 |
| 9,425,018 | B2 | * | 8/2016 | Nohara | ................ | H01H 85/201 |
| 9,787,074 | B1 | * | 10/2017 | Matsumura | .............. | H02G 3/16 |
| 2008/0149387 | A1 | * | 6/2008 | Oda | ........................ | H05K 7/026 |
| | | | | | | 174/520 |

* cited by examiner

*Primary Examiner* — Timothy J Thompson
*Assistant Examiner* — Michael F McAllister
(74) *Attorney, Agent, or Firm* — Honigman LLP

(57) ABSTRACT

A lower cover assembly for use in a power distribution box having a terminal housing assembly is provided. The terminal housing includes a pair of side walls spaced apart from each other, a front wall opposite a back wall and a floor. A clip is configured to engage the terminal housing. The clip includes a front contact surface opposite a second contact surface. A connecting wall is disposed between the first and second contact surfaces so as to define a "U" shape member. The first contact surface is mounted to a top surface of a terminal housing and the second contact surface is mounted to a bottom surface of the terminal housing. The clip is form of an electrically conducted material so as to route electricity.

15 Claims, 11 Drawing Sheets

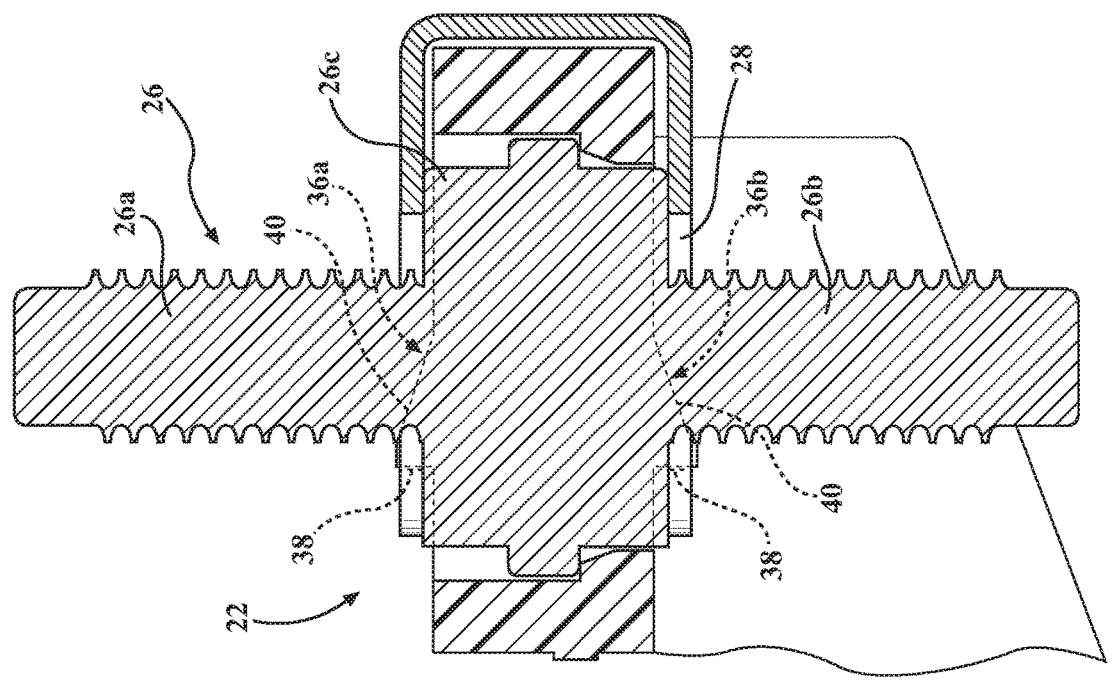
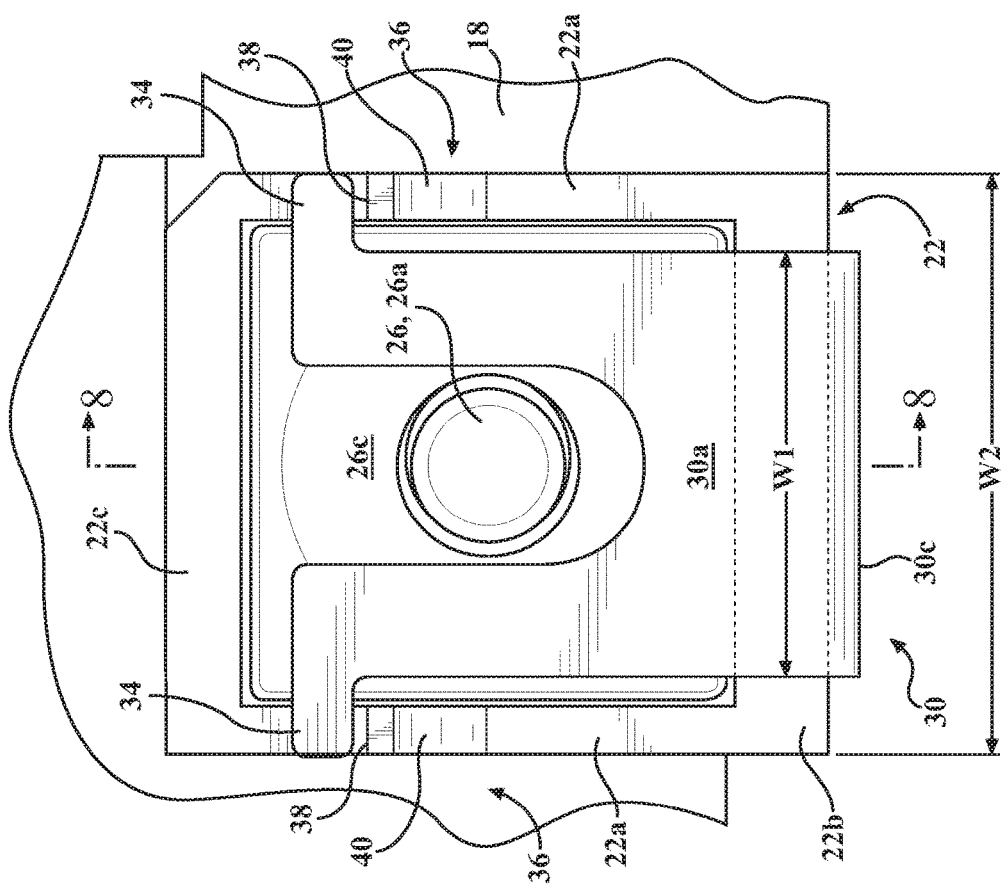
FIG. 7
FIG. 8

TERMINAL HOUSING WITH CONDUCTIVE CLIP

The present disclosure relates to a lower cover assembly for use in a power distribution box and more particularly to a lower cover assembly having a terminal housing configured to direct electrical power to multiple terminal connectors.

BACKGROUND

With reference first to FIG. 12 an isolated view of a lower cover assembly 200 of a power distribution box is shown. The power distribution box is configured to distribute power to a top portion and a base 210 of the lower cover assembly 200. A bus bar (not shown) provides power to the electrical components housed in the top portion and base 210 of the lower cover assembly 200.

The base 210 shows a conventional terminal housing 212. The terminal housing 212 includes a pair of side walls 212*a*, a back wall 212*b* and a front wall 212*c* in bounding a floor (not shown). The floor includes an opening and a stud 214 is mounted into the opening. The bus bar is electrically connected to the stud and to a power source so as to distribute power from the power source through the stud 214.

The stud 214 is configured to receive a first terminal connector and a second terminal connector (not shown). The stud 214 includes a base (not shown) having a diameter greater than the diameter of the shaft of the stud 214 and divides the stud into an upper half 214*a* and a lower half 214*b*.

The first and second terminal connectors are mounted onto respective upper and lower half of the stud. A nut 216 is screwed onto the upper half 214*a* and the lower half 214*b* of the stud 214 so as to clamp the first and second terminal connectors onto corresponding upper and lower halves 214*a*, 214*b* of the stud 214. Accordingly, it remains desirable to have a terminal housing assembly configured to direct electrical power to multiple terminal connectors without causing any power loss.

SUMMARY

A lower cover assembly for use in a power distribution box having a terminal housing assembly is provided. The terminal assembly housing is configured to house a terminal assembly. The terminal assembly includes a threaded stud and a terminal housing. The terminal housing includes a pair of side walls spaced apart from each other, a front wall opposite a back wall and a floor.

A clip is configured to engage the terminal housing. The clips includes a front contact surface opposite a second contact surface. A connecting wall is disposed between the first and second contact surfaces. The connecting wall maybe formed on a front end of the first and second contact surfaces so as to define a "U" shaped member. The first contact surface is mounted to a top surface of the pair of side walls and the second contact surface is mounted to a bottom surface of the pair of side walls.

The clip is form of an electrically conducted material so as to route electricity to both the first and second contact surfaces. The first and second contact surfaces are electrically connected to the stud so as to receive power from the power source. The first and second terminal connectors are laid upon respective first and second contact surfaces. Engagement of the nut applies a torque onto the first and second contact terminals which may rotate about the first and second contact surfaces, wherein the first and second contact surfaces remain relatively fixed with respect to the stud so as to maintain the position of the stud while routing electricity to a bottom of the terminal housing.

BRIEF DESCRIPTION OF THE DRAWINGS

The embodiments set forth in the drawings are illustrative and exemplary in nature and not intended to limit the subject matter defined by the claims. The following description of the illustrative embodiments can be understood when read in conjunction with the following drawings, where like structure is indicated with like reference numerals and in which:

FIG. 7 is a top down view of the terminal housing assembly showing the stud and the clip;

FIG. 8 is a cross-section view of FIG. 7 taken along line 8-8;

DETAILED DESCRIPTION OF PREFERRED EMBODIMENTS

Referring to generally to the FIGS, embodiments of the present disclosure is directed towards a lower cover for use in the powered distribution box having a terminal housing assembly and a clip configured to engage the stud so as to direct electricity to a plurality of terminal connectors to include terminal connectors mounted to the top and bottom of the terminal housing assembly.

Figure 1:
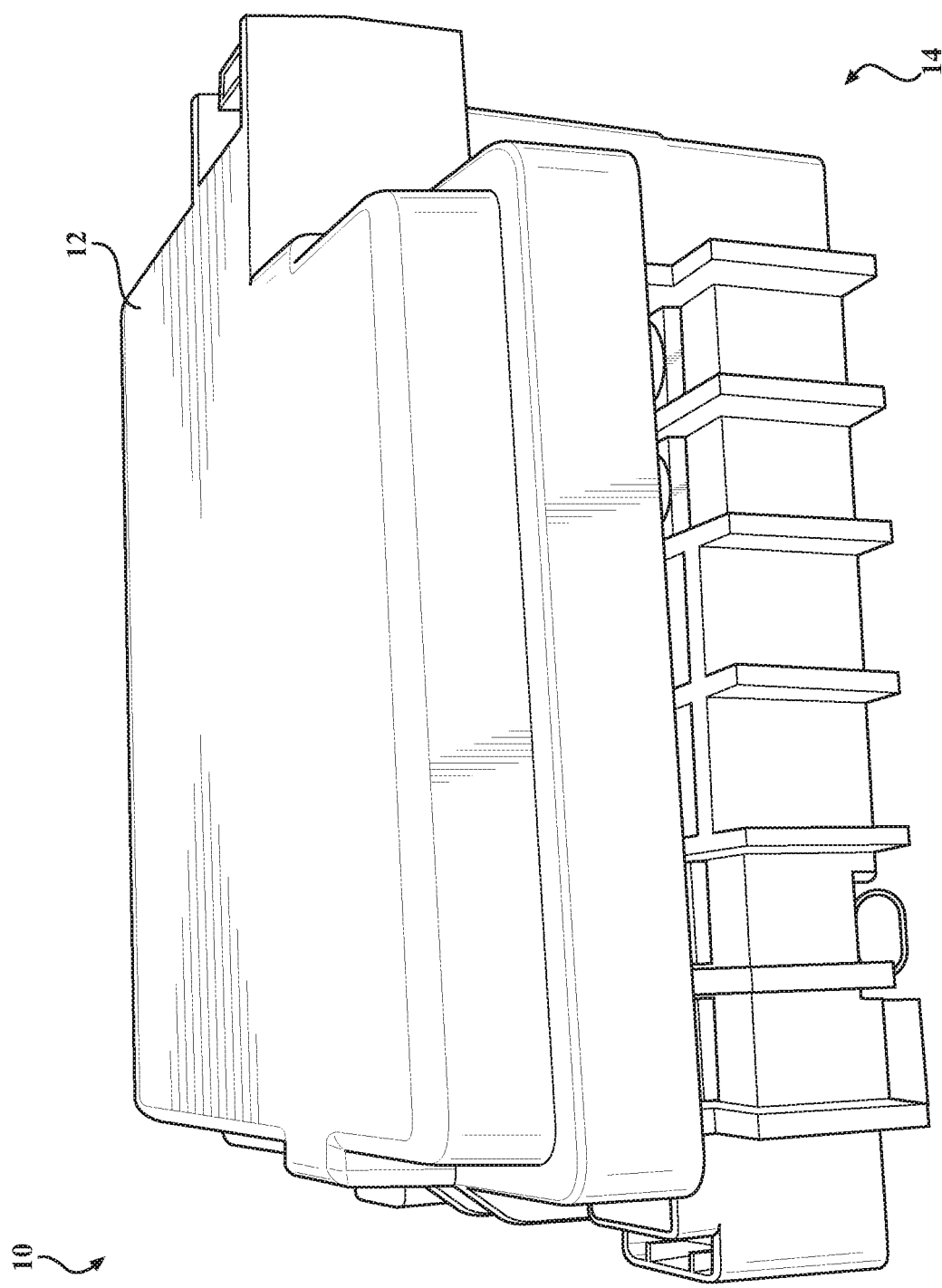
FIG. 1 is a perspective view of a power distribution box assembly.

With reference first to FIG. 1, a power distribution box assembly 10 is shown. A power distribution box assembly 10 includes a top cover 12, a lower cover assembly 14. The power distribution box assembly 10 houses a plurality of electric components and maybe configured to receive power from a first and second power sources (not shown). The power distribution box assembly 10 may be mounted in various locations of an automotive vehicle so as to distribute power to electrical systems such as a windshield wiper, a heater, side mirrors or the like.

Figure 2:
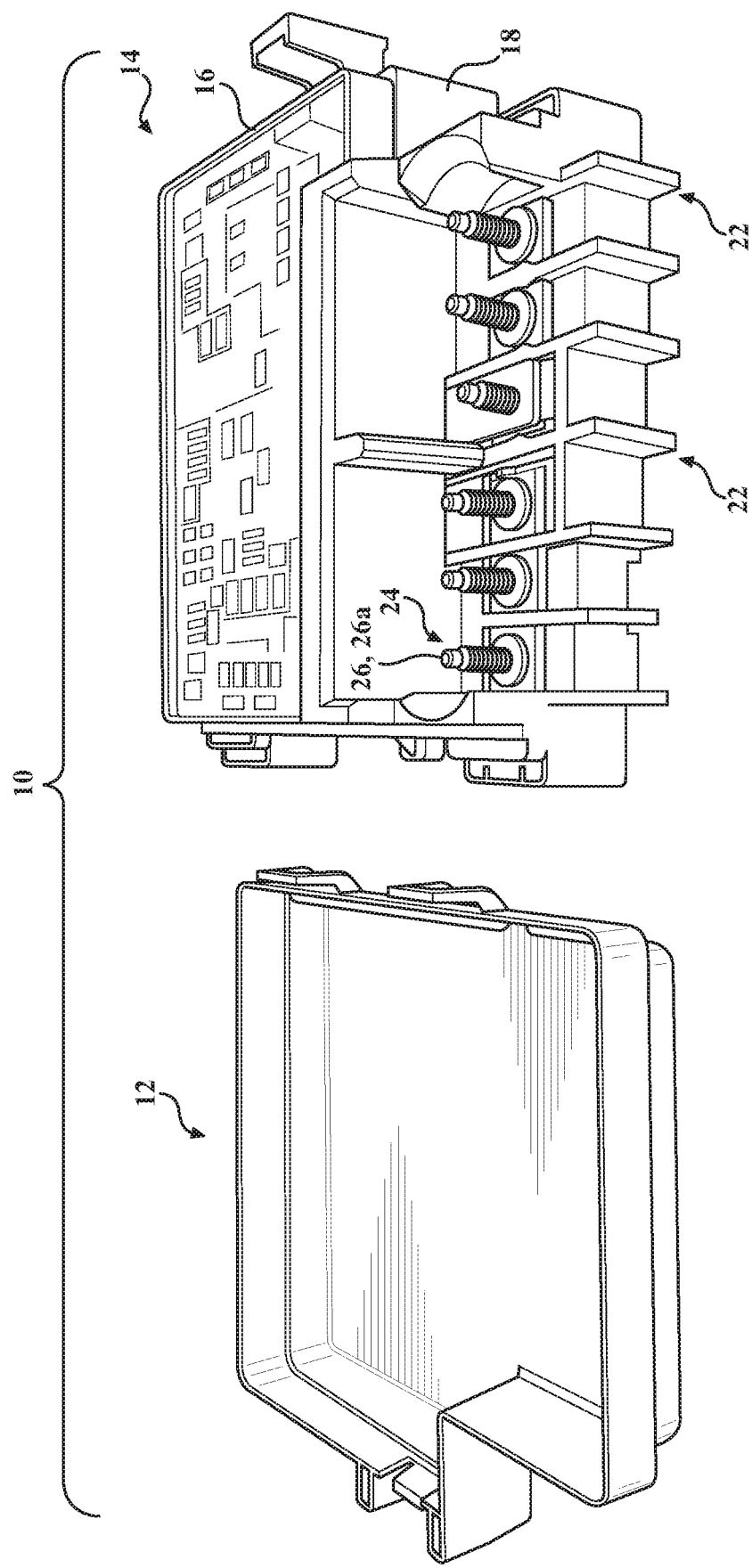
FIG. 2 is a view of the power distribution box assembly shown in FIG. 1 with the upper cover removed.

With reference now to FIG. 2, an exploded view of the power distribution box assembly 10 shown in FIG. 1 is provided. FIG. 2 shows the top cover 12 removed from the lower cover assembly 14. The top cover 12 and the lower cover assembly 14 are secured to each other using conventional fastening features.

Figure 3:
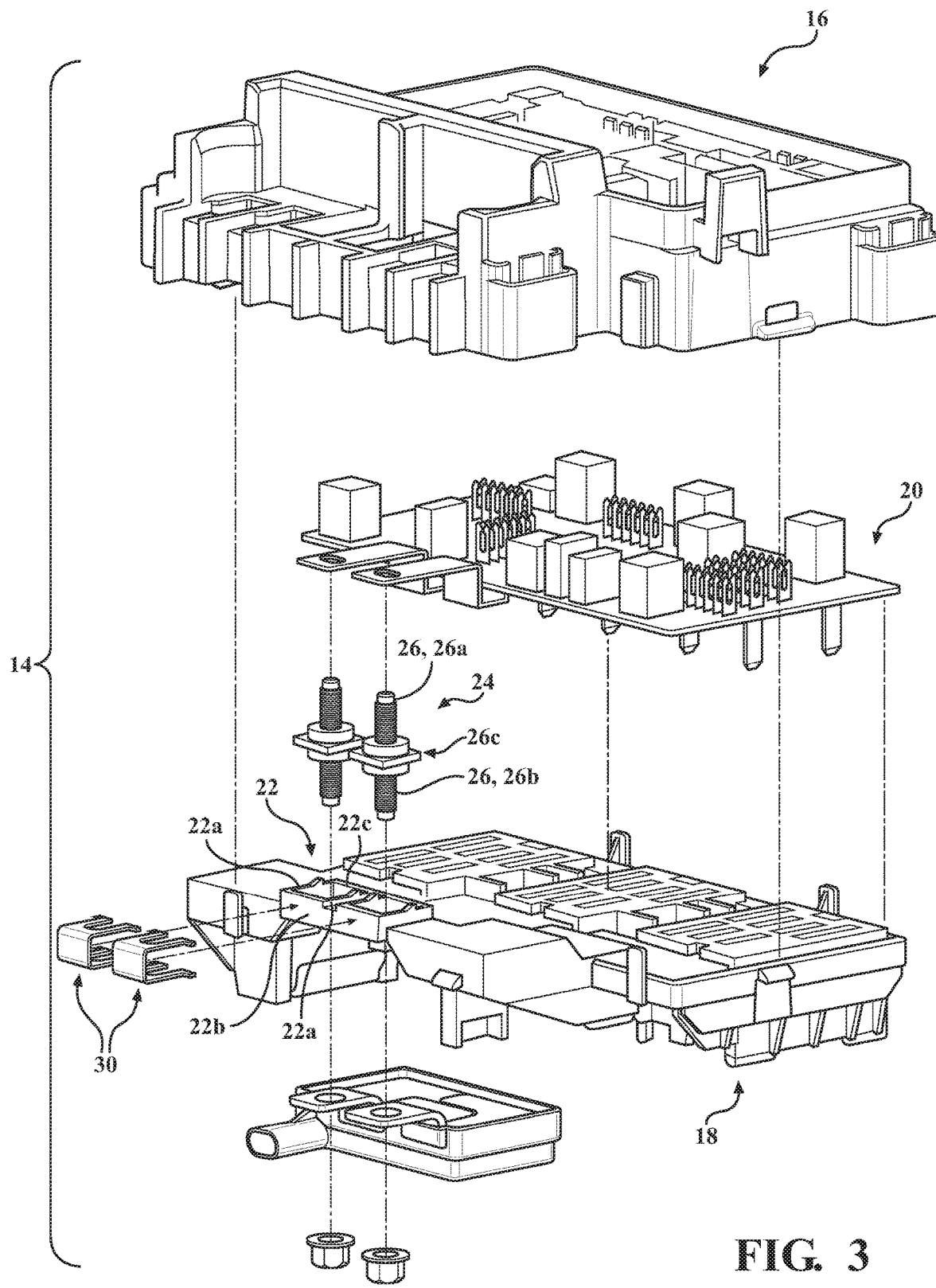
FIG. 3 is an exploded view of the lower cover assembly shown in FIG. 1.

With reference now to FIG. 3, an exploded view of an illustrative example of a lower cover assembly 14 is provided. In one aspect of a power distribution box assembly 10, the lower cover assembly 14 is formed of two parts. In particular, the lower cover assembly 14 includes a lower housing 16 mounted to a lower base 18. The lower housing 16 may be mounted to the lower base 18 using conventional fastening features. A circuit board 20 is mounted to the lower base 18 and the peripheral edge of the circuit board 20 is bound by the lower housing 16. The circuit board 20 houses a plurality of electric components configured to regulate and distribute power to different electrical systems.

The lower base 18 includes a terminal housing 22. The terminal housing 22 is configured to hold a terminal assembly 24. A busbar (not shown) connects the terminal assembly 24 to at least one power source. The terminal assembly 24 includes a stud 26 having an upper half 26a and lower half 26b and a base 26c generally defines and separates the upper half 26a from the lower half 26b. The upper half 26a and the lower half 26b of the stud 26 are threaded.

Figure 4:
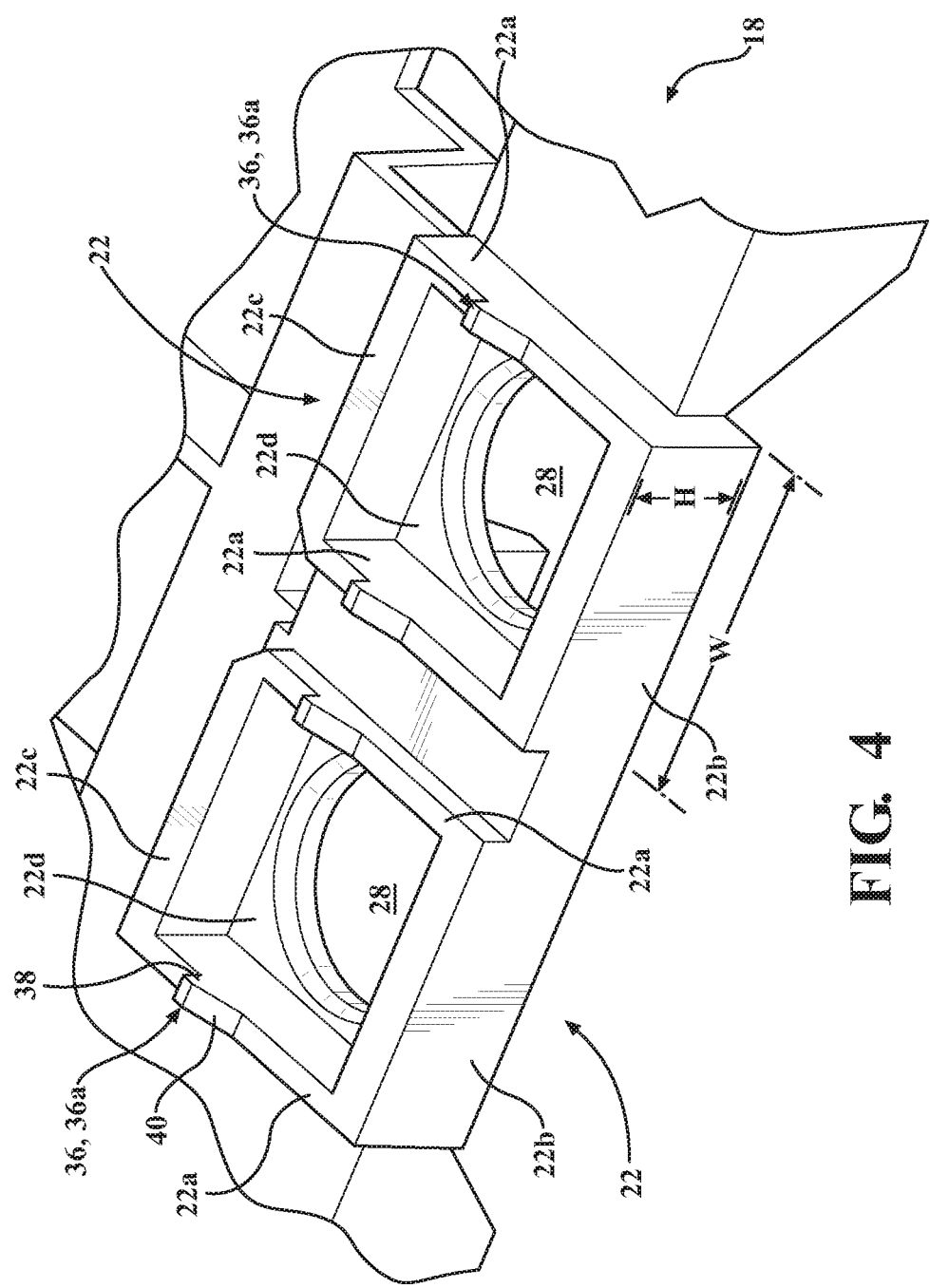
FIG. 4 is an isolated view of a terminal housing in accordance to one or more embodiments described herein.

With reference now to FIG. 4, an isolated view of the terminal housing 22 shown in FIG. 3 is provided. FIG. 4 shows the terminal housing 22 is disposed on the front face of the lower base 18 and has a generally rectangular dimension. The terminal housing 22 includes a pair of side walls 22a that are spaced apart from each other. A front wall 22b is opposite of a back wall 22c and the side, front and back walls 22a, 22b, 22c bound a floor 22d. The floor 22d has an opening 28. The side, front and back walls 22a, 22b, 22c, have a height referenced by the letter "H". The side, front and back walls 22a, 22b, 22c may be made of a material suitable for formation through the injection molding process.

A depiction of the assembly showing the stud 26 inserted into the terminal housing 22 will be described with reference to FIG. 8. The stud 26 is seated within the terminal housing 22 by insertion of the lower half 26b of the stud 26 into the opening 28 of the floor 22d. The base 26c of the stud 26 is wider than the diameter of the opening 28 and the lower half 26b is supported by engagement of the base 26c with the floor 22d of the terminal housing 22.

Figure 5:
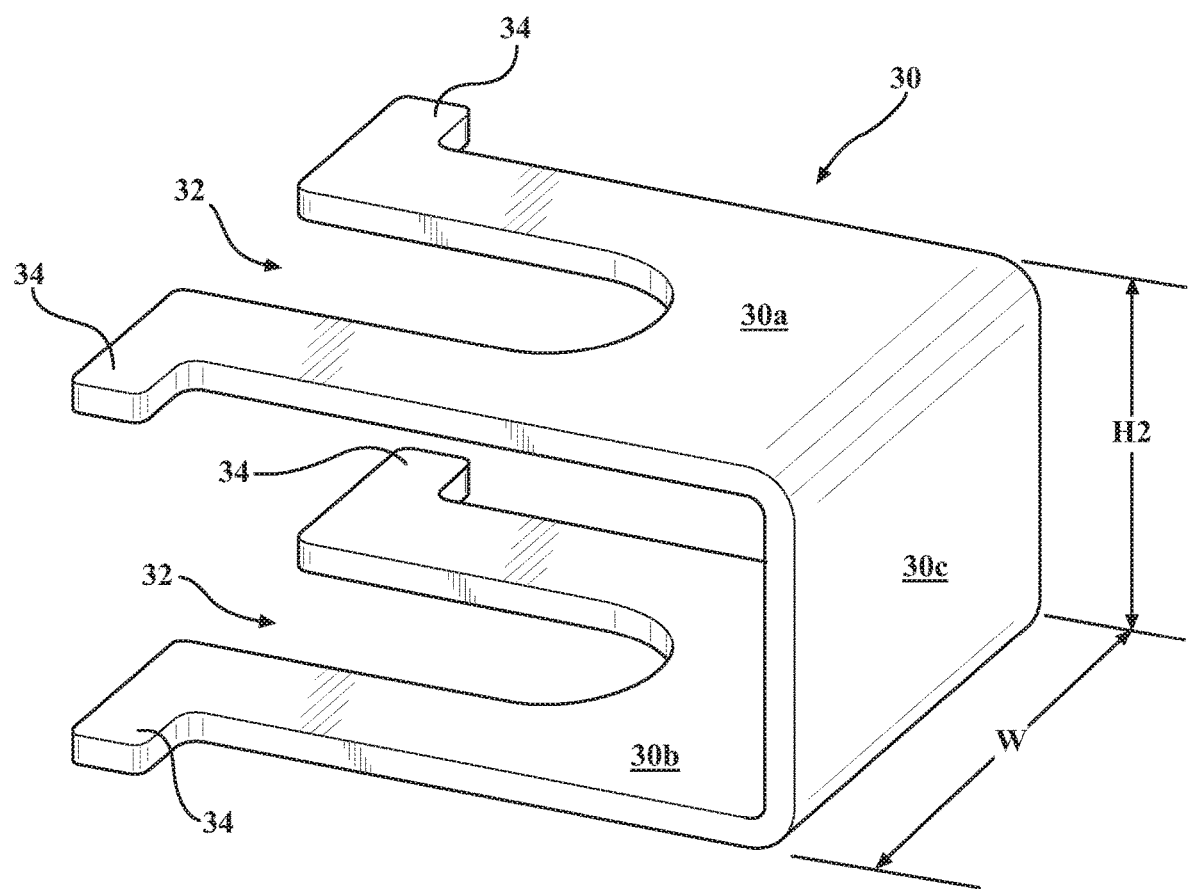
FIG. 5 is an isolated view of a clip in accordance to one or more embodiments described herein.

With reference now to FIG. 5, the lower cover assembly further includes a clip 30. The clip 30 has a first contact surface 30a and a second contact surface 30b that are spaced apart from each other and opposite of each other. A connecting wall 30c joins the first contact surface 30a to the second contact surface 30b and is disposed on a front end of the first and second contact surfaces 30a, 30b so as to define a "U" shaped member. The first contact surface 30a is mounted to a top surface of the pair of side walls 22a and the second contact surface 30b is mounted to a bottom surface of the pair of side walls 22a.

The clip 30 is formed of an electrically conductive material so as to route electricity to both the first and second contact surfaces 30a, 30b. The connecting wall 30c has a height "H2" which is generally the same as the height "H" of the front wall 22b of the terminal housing 22 so as to position an undersurface of the first and second contact surfaces 30a, 30b against respective top and bottom surface of the back wall 22c, as shown in FIG. 8. The first and second contact surfaces 30a, 30b are dimensioned to engage a respective upper and bottom surface of the base 26c of the stud 26 (as shown in FIG. 8) which is generally centered within the walls 22a, 22b, 22c of the terminal housing 22.

In one aspect, the first and second contact surfaces 30a, 30b include a "U" shaped slot 32 which extends along a plane parallel and spaced apart of each other so as to be coplanar with the plane of the respective first and second contact surfaces 30a, 30b. The slots 32 are rounded at a closed end so as to receive the circumferential surface of the stud 26. The first and second contact surfaces 30a, 30b are shown as being generally planar members having a width defined by "W".

Figure 6:
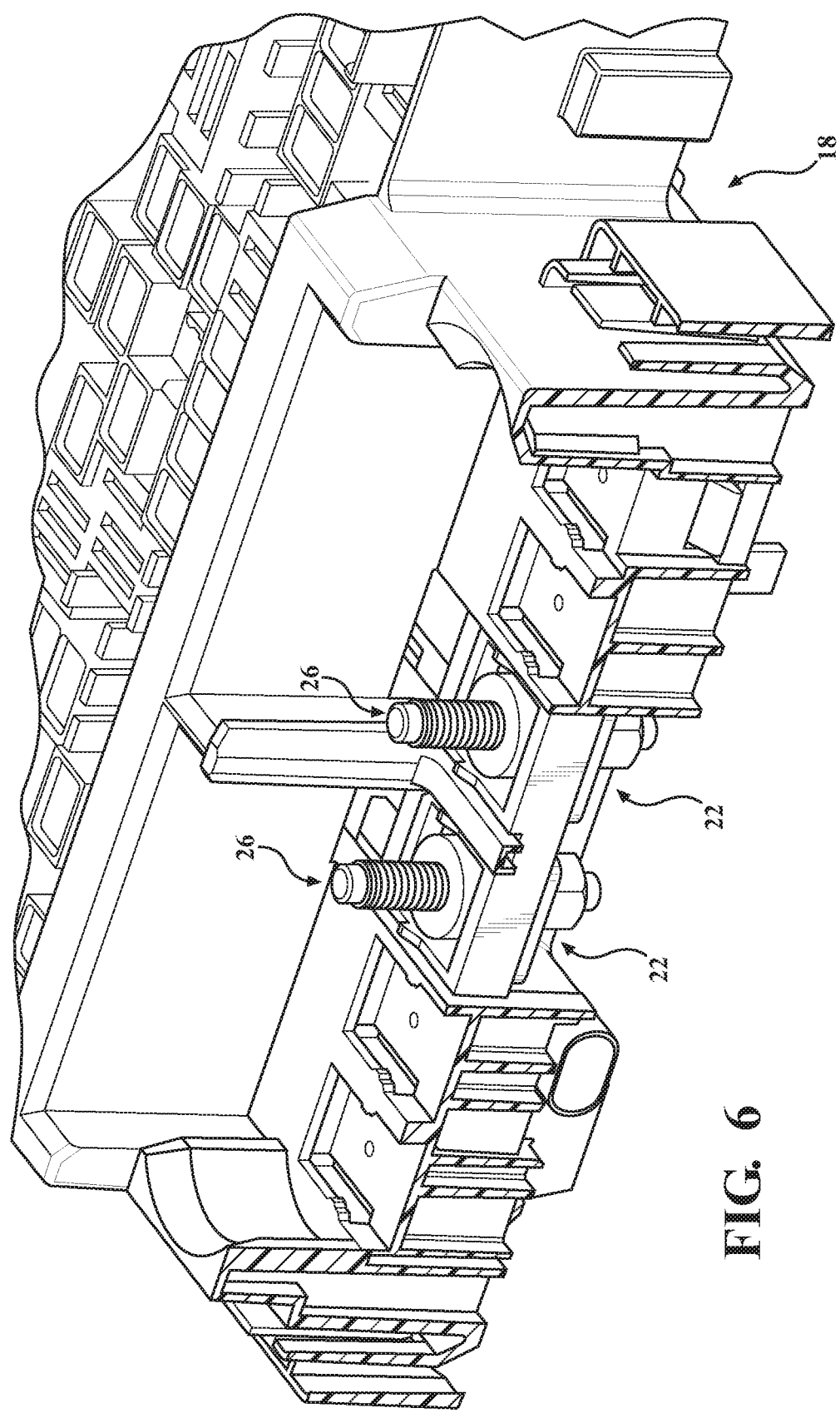
FIG. 6 is view of the terminal housing shown in FIG. 4 with a stud.

FIG. 6 provides a view of the lower base 18 with the studs 26 mounted in the terminal housings 22. A front portion of the lower base 18 is removed to illustrate the terminal housings 22. FIG. 7 provides a top down view showing the clip 30 mounted onto the terminal housing 22. FIG. 7 shows the width "W1" of the first and second contact surfaces 30a, 30b being smaller than the width "W2" of the terminal housing 22.

FIG. 8 is a cross-section view of FIG. 7 taken along line 8-8. FIG. 8 illustrates the clip 30 being turned generally 90 degrees such that the first and second contact surfaces 30a, 30b of the clip 30 engage the top and bottom surfaces of the base 26c of the stud 26.

With reference again to FIGS. 4-8, another aspect of the disclosure is now described wherein the clip 30 is configured to engage the terminal housing 22. The first and second contact surfaces 30a, 30b include a leg 34 extending generally or orthogonal from a peripheral edge of the first and second contact surfaces 30a, 30b. The terminal housing 22 includes a retaining nub 36.

The retaining nub 36 is disposed on a top surface of one of the side walls 22a. In one aspect of a retaining nub 36, the retaining nub 36 is generally a ramp shaped member having a back edge 38 which is generally planar and/or orthogonal to a top surface of the side wall 22a and a slanted top wall 40. The figures show an embodiment of the terminal housing 22 wherein each of the side walls 22a includes a pair of top retaining nubs 36a and a pair of bottom retaining nubs 36b; however, it should be appreciated that only one retaining nub 36 maybe required to help retain the clip 30 in position with respect to the terminal housing 22. However, in a preferred environment, four (4) retaining nubs 36 are provided and the retaining nubs 36 are positioned on the clip 30 so as to press the connecting wall 30c against the front face of the front wall 22b. FIG. 8 illustrates such an embodiment, wherein a top and bottom retaining nub 36a and 36b are illustratively shown in dashed lines.

In one aspect the clip 30 may include four legs 34. The legs 34 extend generally orthogonal from a peripheral edge of the first or second contact surfaces 30a, 30b. The leg 34 is configured to engage the retaining nub 36. The figures show an embodiment where the clip 30 includes a pair of first legs 34a disposed on opposite peripheral edges of the first contact surface 30a and defined a generally "L" shaped end portion. Likewise, the second contact surface 30b includes a pair of second legs 34b extending generally orthogonal from the peripheral edge of the second contact surface 30b. FIG. 7 shows the first pair of legs 34a engaged with the top retaining nubs 36a. Likewise, the second pair of legs 34b are engaged with the bottom retaining nubs 36b. FIG. 8 shows the legs 34 and the retaining nubs 36 working together to press the connecting wall 30c of the clip 30 against the front wall 22b of the terminal housing 22.

FIG. 7 illustrates how the legs 34 are configured to engage the retaining nub 36 so as to position the rounded end of the respective slots 32 away from the other circumferential surface of the stud 26. As such, the engagement of a terminal connector is results in the contact of the terminal connector with the surfaces of the first and second contact surface 30b of the clip 30. In other words, the clip 30 prevents a terminal connector 40 from contacting the base 26c of the stud 26.

In operation, the worker may torque a nut 42 onto to the terminal connector 40 pinching the terminal connector 40 between the nut 42 and the first and second contact surfaces 30a, 30b of the clip 30. Rotation of the terminal connector 40 as a result of the torque applied to the nut creates a torque on the first contact surface 30a. Thus unlike the prior art, there is no friction applied to the base and thus the position of the stud is maintained.

Figure 9:
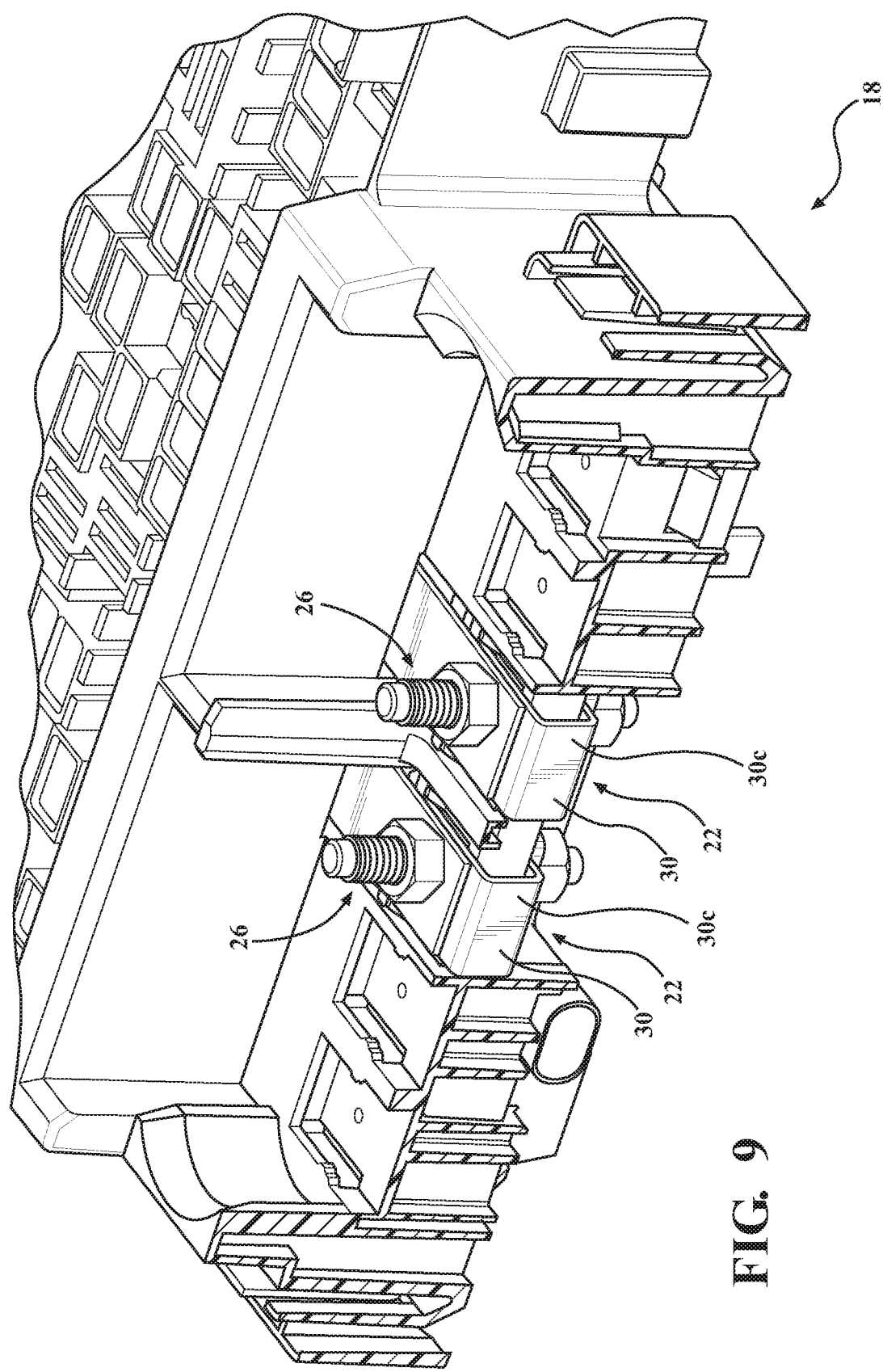
FIG. 9 is a perspective view of the lower cover assembly.

With reference now to FIG. 9 a view of an assembled lower cover assembly 14 is provided. The lower cover assembly 14 maybe assembled for installation with the stud 26 seated in the terminal housing 22 and the "U" shaped clip 30 is then mounted onto the terminal housing 22 wherein the legs 34 are slid over the respective top and bottom retaining nubs 36a, 36b and the rounded ends of the slot 32 are spaced apart from the shaft of the stud 26. The retaining nubs 36 lock the legs 34 so as to press the connecting wall 30c against the front wall 22b of the terminal housing 22. The first and second contact surfaces 30a, 30b engage a top and bottom surface of the base 26c. FIG. 9 illustrates how the clip 30, being formed of an electrically conductive material, conducts electricity to a lower portion of the lower base 18.

Figure 10:
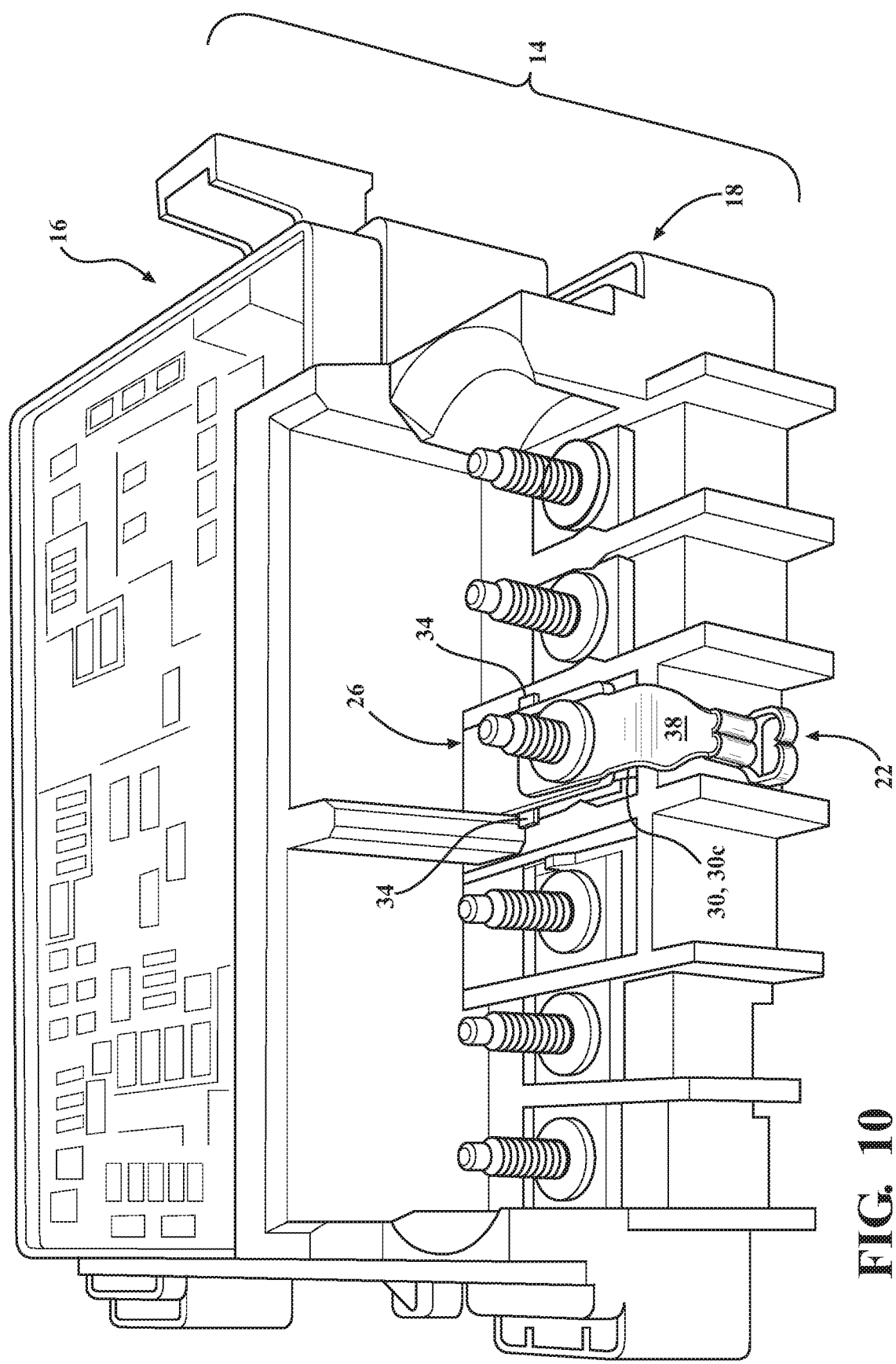
FIG. 10 is a view of the lower cover assembly showing the terminal connector mounted to the terminal housing.
Figure 11:
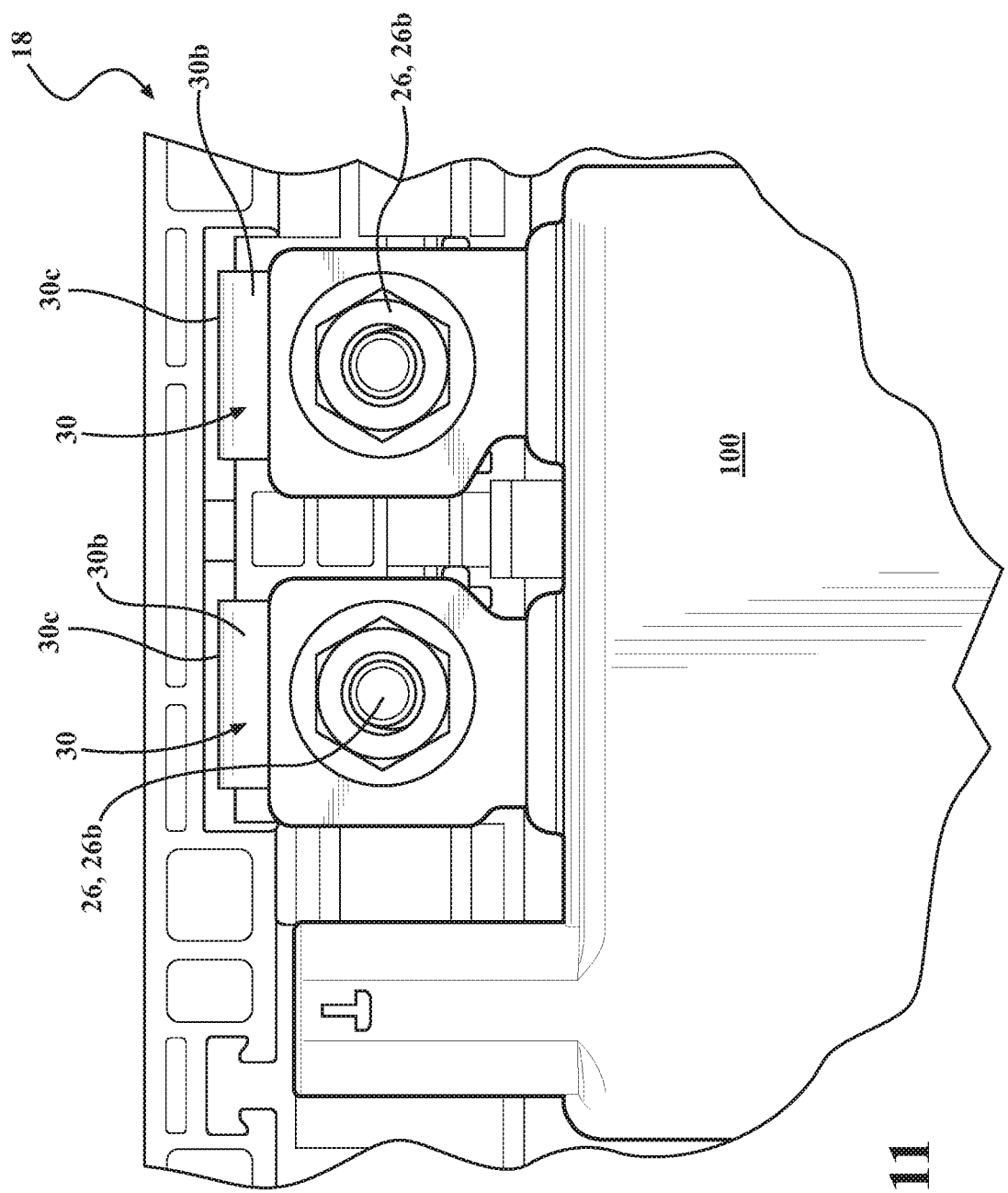
FIG. 11 is a view of the lower cover assembly shown in FIG. 9 taken from the bottom.
Figure 12:
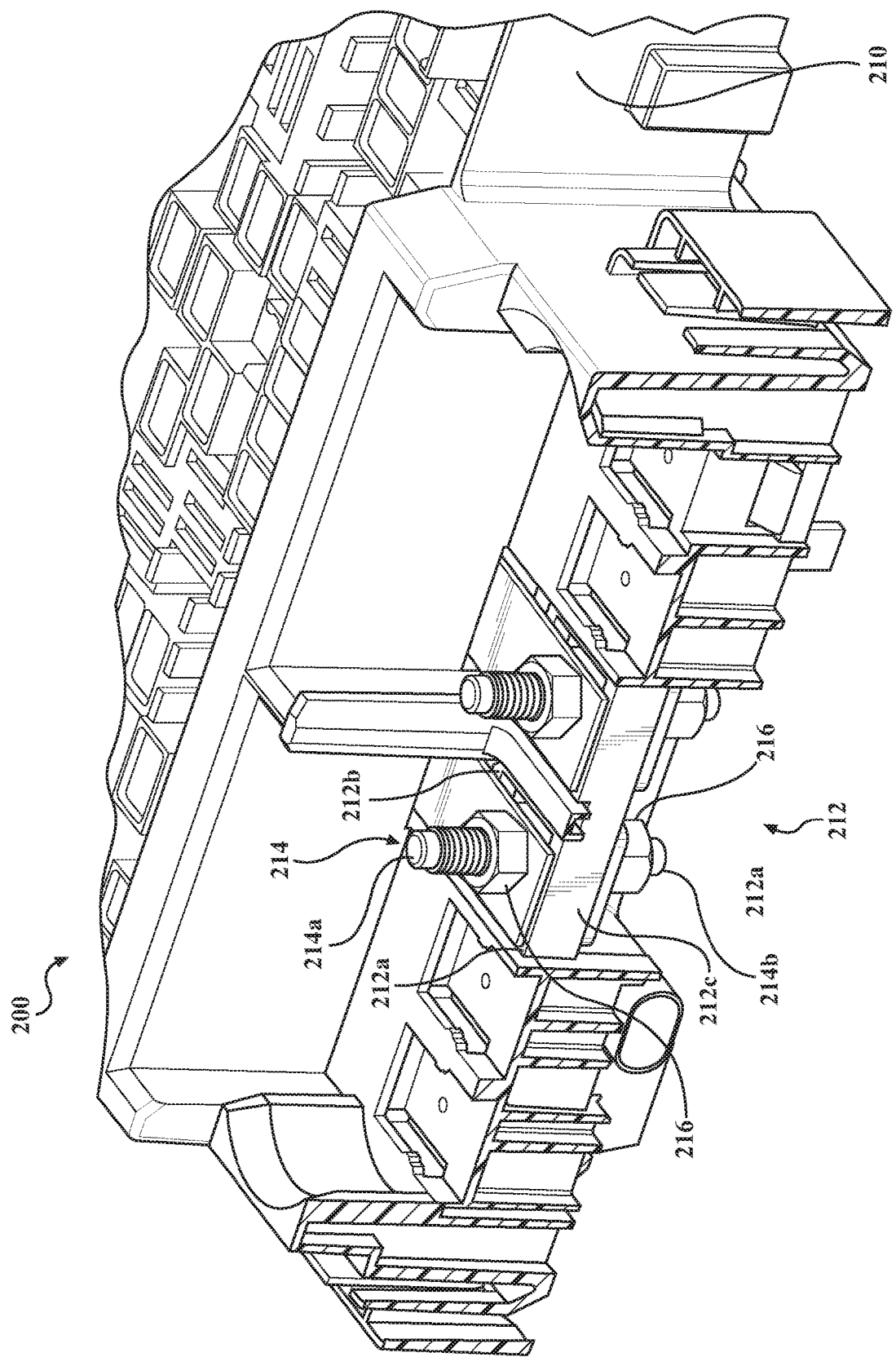
FIG. 12 is a view of a lower cover assembly of the prior art.

FIGS. 10 and 11 also illustrate how the connecting wall 30c conducts electricity from the top of the terminal housing 22 to the bottom of the terminal housing. Terminal connectors 38 may be mounted to upper half 26a of the stud 26 to distribute electric power to various electrical systems. FIG. 11 provides a bottom view of the lower base 18 and shows how the clip 30 may provide power to another electric component 100 disposed on the bottom surface of the lower base 18.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A lower cover for use in a power distribution box, the lower cover configured to house a terminal assembly, the terminal assembly including a stud having a base, the stud generally orthogonal to the base, the lower cover comprising:
 a terminal housing, the terminal housing having a pair of side walls spaced apart from each other, a front wall opposite a back wall and a floor; and
 a clip having a first contact surface opposite a second contact surface and a connecting wall, the connecting wall disposed on a front end of both of the first and second contact surface so as to define a U-shaped member, wherein the first contact surface is mounted to a top surface of the pair of side walls and the second contact surface is mounted to a bottom surface of the pair of side walls, the clip formed of an electrically conductive material so as to route electricity to both first and second contact surface.

2. The lower cover as set forth in claim 1, wherein the first and second contact surfaces include a slot defining an open end, the slot configured to receive the stud.

3. The lower cover as set forth in claim 1, wherein the top surface of at least one of the pair of side walls includes a top retaining nub configured to engage the first contact surface of the clip.

4. The lower cover as set forth in claim 3, wherein the first contact surface includes a first leg extending generally orthogonal from a peripheral edge of the first contact surface, the first leg configured to engage the top retaining nub.

5. The lower cover as set forth in claim 1, wherein the bottom surface of at least one of the pair of side walls includes a bottom retaining nub configured to engage the second contact surface of the clip.

6. The lower cover as set forth in claim 5, wherein the second contact surface includes a second leg extending generally orthogonal from a peripheral edge of the second contact surface, the second leg configured to engage the bottom retaining nub.

7. The lower cover as set forth in claim 1, wherein the top surface of at least one of the pair of side walls includes a top retaining nub and the bottom surface of at least one of the pair of side walls includes a bottom retaining nub, the top retaining nub configured to engage the first contact surface and the bottom retaining nub configured to engage the second contact surface of the clip.

8. The lower cover as set forth in claim 7, wherein the first contact surface includes a first leg extending generally orthogonal from a peripheral edge of the first contact surface and the second contact surface includes a second leg extending generally orthogonal from a peripheral edge of the second contact surface, the first leg configured to engage the top retaining nub and the second leg configured to engage the bottom retaining nub.

9. A lower cover assembly for use in a power distribution box configured to route electric power to a top terminal connector and a bottom terminal connector, wherein the top terminal connector is electrically connected to a first load and the bottom terminal connector is electrically connected to a second load, the lower cover assembly comprising:
 a stud having an upper half and a lower half and a base disposed between the upper half and the lower half, the upper half configured to receive the top terminal connector and the bottom half configured to receive the bottom terminal connector;
 a terminal housing, the terminal housing having a pair of side walls spaced apart from each other, a front wall opposite a back wall and a floor, the floor having an opening the lower half of the stud disposed in the opening and the base supported by the floor; and
 a clip having a first contact surface opposite a second contact surface and a connecting wall, the connecting wall disposed on a front end of both of the first and second contact surface so as to define a U-shaped member, wherein the first contact surface is mounted to a top surface of the pair of side walls and the second contact surface is mounted to a bottom surface of the pair of side walls, the first and second contact surfaces include a slot defining an open end, the slot configured to receive the stud and the clip is formed of an electrically conductive material so as to route electricity to both first and second contact surface.

10. The lower cover as set forth in claim 9, wherein the top surface of at least one of the pair of side walls includes a top retaining nub configured to engage the first contact surface of the clip.

11. The lower cover as set forth in claim 10, wherein the first contact surface includes a first leg extending generally orthogonal from a peripheral edge of the first contact surface, the first leg configured to engage the top retaining nub.

12. The lower cover as set forth in claim 9, wherein the bottom surface of at least one of the pair of side walls includes a bottom retaining nub configured to engage the second contact surface of the clip.

13. The lower cover as set forth in claim 12, wherein the second contact surface includes a second leg extending generally orthogonal from a peripheral edge of the second contact surface, the second leg configured to engage the bottom retaining nub.

14. The lower cover as set forth in claim 9, wherein the top surface of at least one of the pair of side walls includes a top retaining nub and the bottom surface of at least one of the pair of side walls includes a bottom retaining nub, the top retaining nub configured to engage the first contact surface and the bottom retaining nub configured to engage the second contact surface of the clip.

15. The lower cover as set forth in claim 14, wherein the first contact surface includes a first leg extending generally orthogonal from a peripheral edge of the first contact surface and the second contact surface includes a second leg extending generally orthogonal from a peripheral edge of the second contact surface, the first leg configured to engage the top retaining nub and the second leg configured to engage the bottom retaining nub.

* * * * *